United States Patent
Nee

(10) Patent No.: US 9,368,960 B2
(45) Date of Patent: Jun. 14, 2016

(54) CONVERTER VALVE

(71) Applicant: ABB RESEARCH LTD., Zürich (CH)

(72) Inventor: Hans Peter Nee, Bro (SE)

(73) Assignee: ABB RESEARCH LTD., Zürich (CH)

( * ) Notice: Subject to any disclaimer, the term of this patent is extended or adjusted under 35 U.S.C. 154(b) by 0 days.

(21) Appl. No.: 14/257,482

(22) Filed: Apr. 21, 2014

(65) Prior Publication Data

US 2014/0313796 A1 Oct. 23, 2014

Related U.S. Application Data

(62) Division of application No. 11/887,581, filed on Jan. 18, 2011, now Pat. No. 8,755,206.

(30) Foreign Application Priority Data

Mar. 31, 2005 (WO) ............... PCT/SE2005/000476

(51) Int. Cl.
| | |
|---|---|
| *H02H 7/122* | (2006.01) |
| *H02H 7/12* | (2006.01) |
| *H02M 1/32* | (2007.01) |
| *H03K 17/082* | (2006.01) |
| *H03K 17/10* | (2006.01) |
| *H03K 17/12* | (2006.01) |
| *H02M 1/088* | (2006.01) |
| *H03K 17/687* | (2006.01) |

(52) U.S. Cl.
CPC . *H02H 7/12* (2013.01); *H02M 1/32* (2013.01); *H03K 17/0828* (2013.01); *H03K 17/107* (2013.01); *H03K 17/127* (2013.01); *H02M 1/088* (2013.01); *H02M 2001/325* (2013.01); *H03K 17/6871* (2013.01)

(58) Field of Classification Search
USPC .................. 363/37, 40, 44, 50, 51, 52, 56.02, 363/56.03, 56.04, 56.05, 56.07, 56.08, 56.1, 363/56.11, 95, 96, 125, 128
See application file for complete search history.

(56) References Cited

U.S. PATENT DOCUMENTS

| | | | |
|---|---|---|---|
| 3,986,103 A | 10/1976 | Frankenberg et al. | |
| 5,214,575 A | 5/1993 | Sugishima et al. | |
| 5,889,663 A * | 3/1999 | Tabata ................. | H03K 17/127 363/56.03 |

(Continued)

OTHER PUBLICATIONS

PCT/ISA/210—International Search Report—Oct. 21, 2005.

(Continued)

*Primary Examiner* — Nguyen Tran
(74) *Attorney, Agent, or Firm* — Birch, Stewart, Kolasch & Birch, LLP

(57) ABSTRACT

A converter valve unit including a plurality of parallel connected controllable semiconducting elements. A free-wheeling diode is connected in anti-parallel with each semiconducting element. A control unit is configured to control each semiconducting element. A current sensor is connected to each of the parallel connected semiconducting elements. The current sensor is configured to sense a current of each semiconducting element by measuring a voltage over the current sensor. A differentiator is configured to compare the currents of the semiconducting elements by comparing the voltages. Upon detecting an unbalance in the currents the differentiator sends a turn-on signal to all control units to control all the semiconducting elements of the valve unit into a conducting stage.

10 Claims, 3 Drawing Sheets

(56) References Cited

U.S. PATENT DOCUMENTS

| | | |
|---|---|---|
| 6,459,380 B1 | 10/2002 | Watanabe et al. |
| 6,683,799 B2 * | 1/2004 | Kato et al. ................... 363/37 |
| 2002/0176261 A1 | 11/2002 | Norrga |

OTHER PUBLICATIONS

PCT/ISA/237—Written Opinion of the International Searching Authority—Oct. 21, 2005.
PCT/IPEA/409—International Preliminary Report on Patentability—May 30, 2007.

* cited by examiner

CONVERTER VALVE

CROSS-REFERENCE TO RELATED APPLICATIONS

This application is a divisional application of co-pending U.S. patent application Ser. No. 11/887,581 filed 1 Oct. 2007, which was the national phase under 35 U.S.C. §371 of PCT/SE2005/000476 filed 31 Mar. 2005.

TECHNICAL FIELD

The present invention concerns an electric power converter. Especially the invention concerns a converter valve comprising a plurality of series connected converter valve units. More precisely the invention concerns a converter valve unit comprising a plurality of semiconducting elements. The invention also relates to a method for controlling such a valve and valve unit. In particular the invention concerns a valve unit of a power converter for transforming a high voltage alternating current to a high voltage direct current and a method for controlling the electric power flow in a converter.

By the expression semiconducting element or semiconductor should be understood any kind of semiconducting element for high power and high voltage applications. Especially such semiconductor comprises an extinguishable or a turn-off kind semiconductor. Examples of power semiconductors of the turn-off kind are a gate turnoff (GTO) thyristor, and an Insulated Gate Bipolar Transistor (IGBT).

BACKGROUND OF THE INVENTION

A circuit comprising a plurality of units with semiconducting elements often constitutes an integral part of an electric power converter, where they are used as power electronic switches. These switches are connectedly arranged in series, where each switch is capable of maintaining a part of the voltage applied over the converter. Known power semiconductors are capable of holding a voltage of 1 to 6 kV. By series connection of a plurality of such switches a converter may maintain a voltage within a range of 10 to 500 kV. Each switch comprises a plurality of semiconducting elements that may be connected in series and/or in parallel to achieve a performance of desire. The series connection will increase the voltage maintenance and the parallel connection will increase the current capacity.

In a voltage source converter (VSC) the electronic power switches comprises semiconductors of the turn-off type. Such converters are often used in high voltage direct current (HVDC) applications for converting direct current to alternating current or conversely. Such converters are also used in static var compensators (SVC) and reactive power compensation (RPC) plants for balancing the power transmission within a power network.

Semiconductors like GTO thyristors and IGBT are suitable for high power applications. Semiconductors of the latter kind is often preferable since they combine good power handling ability with properties which make them well suited for connection in series. They may be turned off with high accuracy. In such constellations a plurality of IGBTs form valves in a voltage source converter for handling voltages up to 500 kV.

Short circuits situations may occur in semiconductor circuits. In such a situation it is necessary to be able to handle the effect of the short circuit. When a semiconductor breaks down as a result of an overcurrent or overvoltage the semiconductor cannot hold a voltage any longer. A damaged semiconductor cannot be controlled. It may hold only a small voltage difference and when conducting there will be a small resistance. A less pleasant performance is the heat generation. Forcing a current through a damaged semiconductor will generate an arc with a voltage drop of approximately 10-20 V that will generate extensive power dissipation. This may either develop into a melt-down of the component or into a fire that may destroy the whole valve.

A converter valve comprises a plurality of semiconducting valve units connected in series. Each of these valve units is designed to handle a determined part of the overall voltage of the valve and to transfer the total current of the valve. Each valve units comprises a plurality of semiconducting elements connected in parallel. Each parallel connected semiconducting element is thus designed to transfer a part of the total current through the valve unit. Now, if one of these semiconducting elements fails, that valve unit will no longer be capable of holding a voltage difference. Still when the whole valve is controlled into a closed circuit, a part of the current or the total current will pass the faulty semiconductor and thus develop heat.

Ta avoid such a situation the semiconducting element used today comprises a special feature of assuming a closed circuit after a fatal breakdown has occurred. By assuming a closed circuit no heat will be generated in the faulty semiconductor. Thus, in the situation described the semiconducting elements in one valve unit are still capable of transferring the same current as would have been when all semiconducting element were in operation. Hence, when one of the semiconductors in a valve unit fails the other semiconductors of that unit are controlled to assume a steady closed circuit. This will result in the unit no longer being capable of holding a voltage but still conduct the current without heat generation.

From a voltage aspect, however, the failing unit will not withstand any voltage since at least one semiconducting unit is always short circuited. This has the effect that the voltage applied over the valve which normally is split up by a plurality of switching units now has to be split by the same number but one. Since the number of series connected units are typically in the range of 100 to 500 the voltage overload is in the range of 0.2 to 10%. This is fully within the voltage overload capacity of the semiconducting element.

The technique of using semiconducting elements which are specially designed for these situation functions very well. These semiconducting elements are, however, costly to produce. Hence, there is a need to lower the cost of the converter but still achieve the same performance.

SUMMARY OF THE INVENTION

A primary object of the present invention is to provide a converter valve unit comprising semiconducting elements, capable of managing the effect of a malfunctioning semiconductor. A secondary object is to provide a sensing system to detect a faulty semiconducting element.

This object is achieved according to the invention by a control apparatus or by a method.

According to the invention a malfunctioning semiconductor of a valve unit is detected by sensing the current through the semiconductors of the unit. Upon detecting a malfunctioning semiconductor the remaining semiconductors of the valve unit are controlled to assume a closed circuit. In an embodiment of the invention the current of each semiconducting element in each valve unit is sensed. In a second embodiment a single sensor is arranged in each valve unit to detect the malfunction of any of the semiconducting elements in the unit. Preferably the semiconductors of each unit of the valve are arranged into two groups. Preferably each group contains an equal amount of semiconductors.

In an embodiment of the invention the conducting wires of the first group of semiconductors are arranged to pass a sensing device in a first direction. The conducting wires of the second group of semiconductors are arranged to pass the sensing device in a second direction. The second direction is arranged opposite to the first direction. When all semiconductors are in function the sum of current going in first direction and in the second direction through the sensing device will be equal. When one of the semiconductors fails, however, the sum of current going in the first direction will be different from the sum of current going the second direction. Hence, a malfunctioning semiconductor may be detected by sensing the current balance between the two groups of conducting wires.

According to the invention the use of a sensing system and a controlling system enables the converter valve unit to be designed of a plurality of semiconducting elements of a common "on the shelf" type. Thus, when sensing a defect semiconductor all semiconductors of that valve unit is controlled into a conducting stage. This results in the valve unit being short circuited and not withholding any voltage. In this situation the rest of the series connected valve units will have to maintain the voltage over the valve. As a result each still functioning valve unit has to hold a greater part of the overall valve voltage.

The sensing unit is arranged to sense a current flow. A first type of sensor is a small resistor in the current path, over which the voltage is determined. A second type of sensors is a device capable of sensing a change of magnetic flux caused by the current. One such sensor is a ring of magnetizable material, such as ferrite, comprising an electric coil around the ring part for sensing a current through the ring. Another sensor is just an electric coil formed of an insulated conductor, which senses a current flowing through the coil. Still a further sensor is a Rogowski coil, which is an "air-cored" toroidal coil placed round the conductor.

In a state where all semiconducting elements are in function the sum of current from a first group of semiconductors is flowing in the first direction is equal to the sum of current from a second group of semiconductors flowing in the second direction. The magnetic flux caused by the current in the first direction would be equal the magnetic flux caused by the current in the second direction. Hence, a sensor of the second type would in this situation sense nothing. In a state where one semiconductor of the first group has been damaged and cannot hold a voltage difference but conducting a current under resistance there will be less current conducted by the first group than the second group. Hence, by just one sensor of the second type a malfunctioning semiconductor is rapidly detectable. The sensor also detects which of the two groups that contains the malfunctioning element. This information may be used when the valve is stopped for maintenance.

In a first aspect of the invention the object is achieved by a converter valve unit comprising a plurality of parallel connected semiconducting elements, wherein the converter valve unit comprises a current sensing device for sensing the current flow of the semiconductors and a controlling device for controlling upon a detected malfunctioning semiconductor all the semiconductors of that unit into a conducting stage. In an embodiment of this aspect the semiconducting elements comprises a first group with conducting wires passing the sensing device in a first direction and a second group with conducting wires passing the sensing device in a second direction. In a further embodiment of this aspect the first direction is opposite the second direction.

In a second aspect of the invention the objects are achieved by a method for detecting a semiconducting element in a converter valve unit, wherein the elements are arranged in a first group and a second group. The current flow of the first group is arranged to pass a sensing device in a first direction and the current flow of the second group is arranged to pass the sensing device in a second direction. Then the difference in the current flow trough the sensing device serves to detect the presence of a damaged semiconductor.

BRIEF DESCRIPTION OF THE DRAWINGS

Other features and advantages of the present invention will become more apparent to a person skilled in the art from the following detailed description in conjunction with the appended drawings in which.

DESCRIPTION OF PREFERRED EMBODIMENTS

Figure 1:
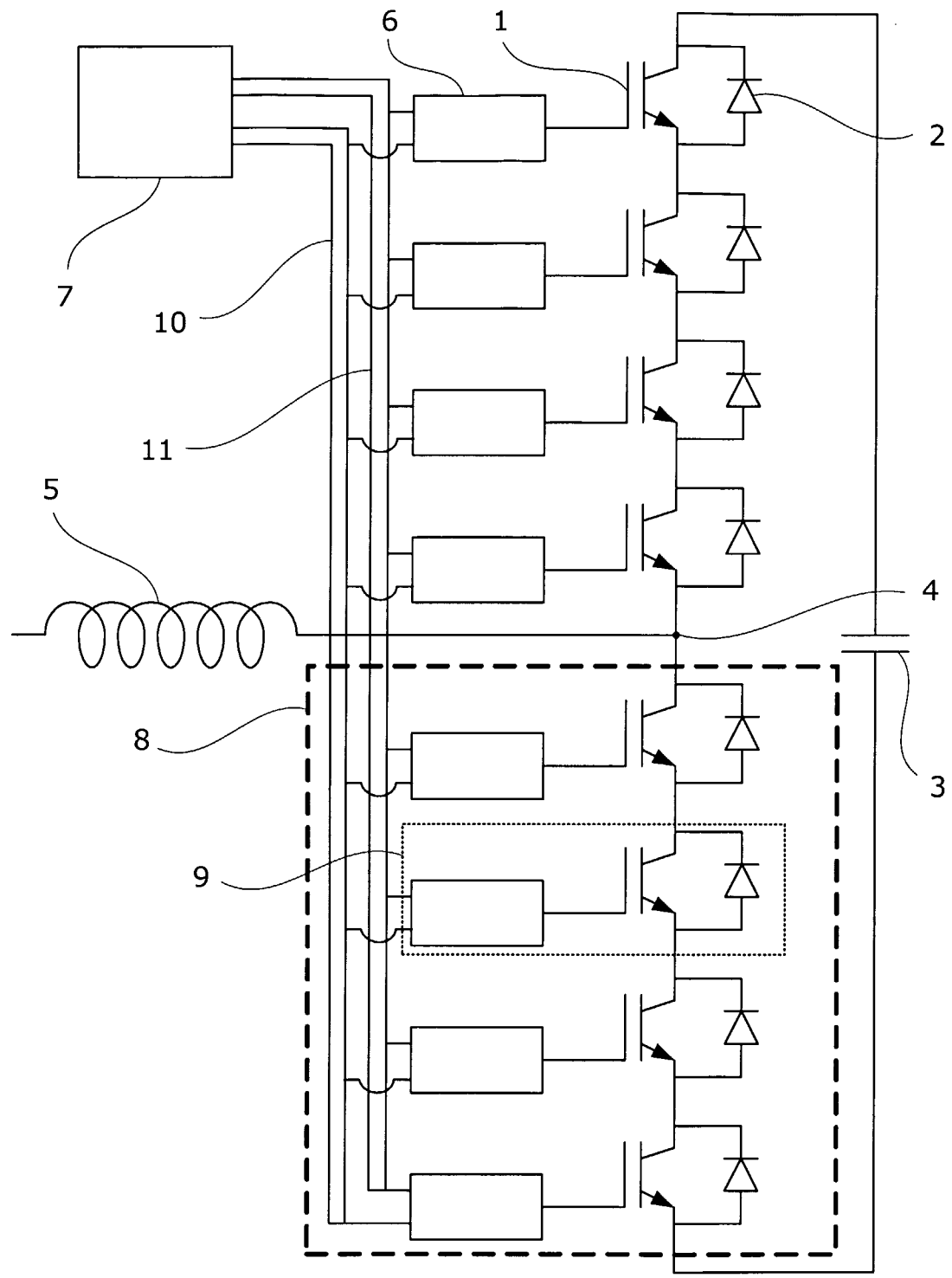
FIG. 1 is a simplified diagram illustrating a phase leg of a power converter.

A phase leg of a high voltage converter circuit, to which the present invention is applicable, is schematically shown in FIG. 1. There are normally three phase legs having a DC capacitor 3 in common in a plant connected to a three-phase alternating current network. The phase leg comprises a first and second valve of which only the second valve 8 is indicated in the figure. Each valve comprises a plurality of valve units 9, of which only one is indicated. Each valve unit comprises a power semiconductor device comprising a semiconductor 1, a so-called free-wheeling diode 2 connected in anti-parallel with the semiconductor and a control device 6 for controlling the semiconductor. In the embodiment shown the semiconductor is an IGBT. The number of valve units connected in series is, in practice, considerably higher than indicated in FIG. 1.

The series connected valve units are connected in parallel with a DC capacitor 3. A terminal 4 between the first valve and the second valve 8 is connected through a phase reactor 5, for example, to a phase of an alternating voltage network (not shown).

All power semiconductor devices in an IGBT valve are turned on simultaneously through signals from a drive unit 6, each schematically indicated, so that the power semiconductor devices in the first IGBT valve are conducting when a positive potential is desired at the phase terminal 4 and the power semiconductor devices in the second IGBT valve are conducting when a negative potential is desired on the phase terminal 4.

By controlling the power semiconductor devices according to a determined pulse width modulation (PWM) pattern, the direct voltage across the DC capacitor 3 may be used for generating a voltage at the phase terminal 4, the fundamental component of which is an alternating voltage having a desired amplitude, frequency and phase position. Such controlling takes place by sending control pulses to the different drive units from a control apparatus 7. The communication is effected by sending order pulses through a first communication bundle 10 and by receiving information from the valve units through a second communication bundle 11 of optical fibers.

Figure 2:
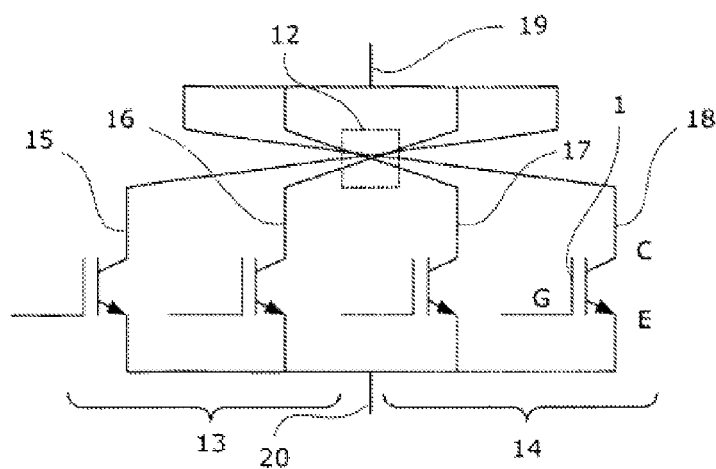
FIG. 2 is an arrangement of semiconductors of a valve unit according to the invention.

A first embodiment of a converter valve unit is shown in FIG. 2. In the embodiment four semiconductors are connected in parallel between a first connection point 19 and a second connection point. The valve unit also comprises a current sensing device 12. The semiconductors, each having an emitter E, a collector C and a gate G, are arranged in a first group 13 and a second group 14. The conducting paths 15, 16 from the first group are arranged in a first direction through the sensing device 12. The conducting paths 17, 18 from the second group are arranged in a second direction through the sensing device 12. The sensing device comprises a magnetic flux detectable device. Thus when the current in all paths are equal the magnetic flux from the first group is equal the magnetic flux from the second group, whereby the sensing device senses no magnetic flux caused by the current in the paths. If, however, one of the semiconductors is damaged and the inner resistance is increased there will be a difference in the magnetic flux caused by the current paths of the first group and the current paths of the second group. Hence, when one of the semiconductors of the valve unit has been damaged the presence of a damaged or malfunctioning semiconductor is detectable by one sensor only.

Figure 3:
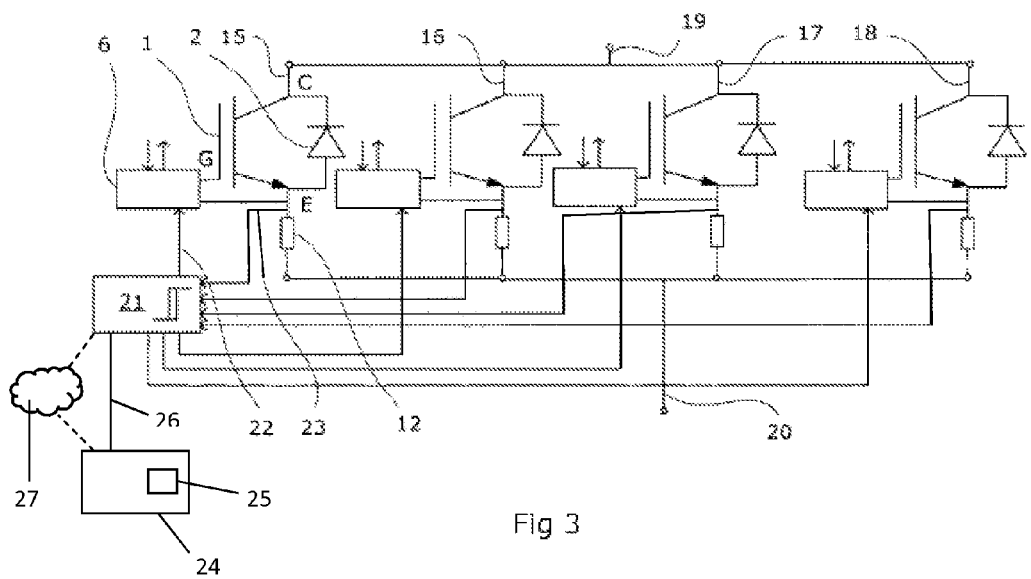
FIG. 3 is a second arrangement of semiconductors of a valve unit according to the invention.

A second embodiment of a valve unit according to the invention is shown in FIG. 3. The valve unit comprises four semiconducting units comprising a semiconductor element 1 of a turn-off type in anti-parallel connection with a free-wheeling diode 2. Each semiconducting unit comprises a current path 15, 16, 17 and 18 connected in parallel between a first connection point 19 and a second connection point 20. For the sake of clearness only the leftmost semiconductor unit has reference numbers. Each semiconductor unit is controlled by a control device 6, also known as a gate unit. In this embodiment the emitter E of each semiconductor is connected via a sensing unit 12 to a second grid point 20 for series connection with a next valve unit in the valve. In the embodiment shown the sensor 12 comprises a resistor. In a valve unit where all semiconductors are in function the voltage downstream the resistor should be equal or almost equal for every semiconductor in the unit. A differentiator 21 compares the downstream voltage signals 23 and on detecting an unbalance in these voltage signals a turn-on signal 22 is sent to all semiconductors or gate-units in the valve unit.

A damaged semiconductor will exhibit a greater inner resistance than a non-damaged semiconductor. Hence, when conducting there will be a lesser current through a malfunctioning semiconductor. Thus, by sensing the current either by the method shown in FIG. 2 or FIG. 3 the occurrence of a malfunctioning semiconductor is detectable.

On detecting a malfunctioning semiconductor the controlling unit 6 of the unit (FIG. 1) or all of the controlling units 12 (FIG. 3) of the valve unit is ordered to control all semiconductors of the same valve unit into a closed circuit stage.

Figure 4:
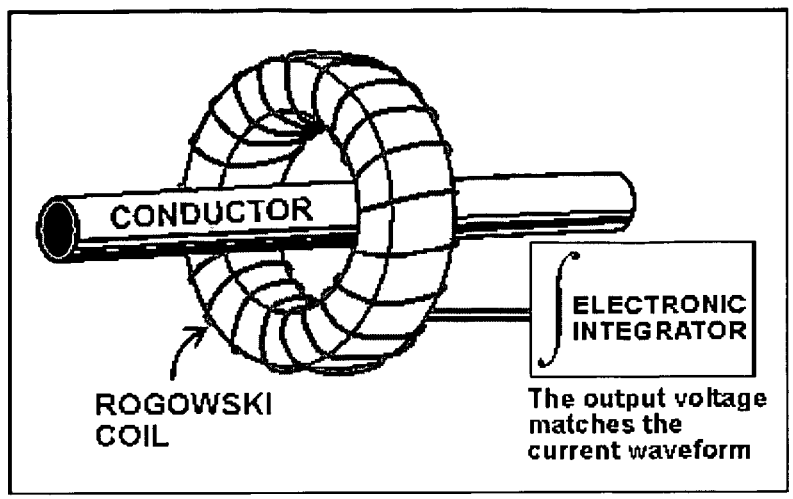
FIG. 4 is a Rogowski coil.

A sensor of a Rogowski coil is shown in FIG. 4. One of the most important properties of a Rogowski coil measuring system is that it is inherently linear. The coil contains no saturable components and the output increases linearly in proportion to current right up to the operating limit determined by voltage breakdown. The integrator is also inherently linear up to the point where the electronics saturates. Linearity makes Rogowski coils easy to calibrate because a transducer can be calibrated at any convenient current level and the calibration will be accurate for all currents including very large ones. Also, because of their linearity, the transducers have a very wide dynamic range and an excellent transient response.

The invention also includes a computer program product including a computer readable medium 24, computer program instructions 25 recorded on the computer readable medium and executable by a processor to carry out the method. The computer program instructions may provide the computer program instructions at least in part over a network 26. The computer program instructions may provide the computer program instructions at least in part over the internet 27.

Although favorable the scope of the invention must not be limited by the embodiments presented but contain also embodiments obvious to a person skilled in the art. For instance the sensing unit for detecting a malfunctioning semiconductor may comprise any feasible detecting device known to a skilled person.

The invention claimed is:

1. A converter valve unit, comprising:
   a plurality of parallel connected controllable semiconducting elements;
   a plurality of free-wheeling diodes, each of the free-wheeling diodes being connected in anti-parallel with a corresponding one of the semiconducting elements;
   a plurality of control units, each of the control units being configured to control a corresponding one of the semiconducting elements;
   a plurality of current sensors, each of the current sensors being connected to a corresponding one of the parallel connected semiconducting elements, wherein each of the current sensors is configured to sense a current of the corresponding one of the semiconducting elements by measuring a voltage over the corresponding current sensor; and
   a differentiator configured to compare the currents of the semiconducting elements by comparing the voltages, wherein upon detecting an unbalance between the current of any one of the semiconducting elements and the current of another one of the semiconducting elements, the differentiator sends a turn-on signal to all of the control units to control all the semiconducting elements of the converter valve unit into a conducting stage.

2. The converter valve unit according to claim 1, wherein each of the current sensors comprises a resistor in a current path of the corresponding one of the semiconducting elements.

3. A method for controlling a converter valve unit comprising a plurality of controllable semiconducting elements, each controllable semiconducting element being connected in anti-parallel with a free-wheeling diode and controlled by a control unit, the method comprising:
   sensing a current through each of the semiconducting elements by measuring a voltage over a current sensing device;
   comparing the currents by comparing the voltages with a differentiator; and
   providing with the control unit, upon the detection of an unbalance between the current of any one of the semiconducting elements and the current of another one of the semiconducting elements, a signal for controlling all semiconducting elements of the converter valve unit to assume a closed circuit.

4. The method according to claim 3, wherein the sensing device comprises a resistor in the current path of each of the semiconducting elements.

5. A computer program product, comprising:
   a non-transitory computer readable medium; and
   computer program instructions recorded on the computer readable medium and executable by a processor to carry out a method comprising sensing a current through each of semiconducting elements of a converter valve unit by measuring a voltage over a current sensing device, comparing the currents by comparing the voltages with a differentiator, and providing with a control unit, upon the detection of an unbalance between the current of any one of the parallel connected semiconducting elements and the current of another one of the parallel connected semiconducting elements, a signal for controlling all semiconducting elements of the converter valve unit to assume a closed circuit.

6. The computer program product according to claim 5, wherein the computer program instructions are further for providing the computer program instructions at least in part over a network.

7. The computer program product according to claim 5, wherein the computer program instructions are further for providing the computer program instructions at least in part over the internet.

8. The converter valve unit according to claim 1, wherein when all the semiconducting elements of the converter valve unit into the conducting stage, the converter valve unit is short circuited.

9. The method according to claim 3, wherein when all of the semiconducting elements of the converter valve unit assume the closed circuit, the converter valve unit is short circuited.

10. The computer program product according to claim 5, wherein when all of the semiconducting elements of the converter valve unit assume the closed circuit, the converter valve unit is short circuited.

* * * * *